Nov. 29, 1960 E. R. ARNOLD ET AL 2,962,606
MONOSTABLE TRANSISTOR CIRCUITS
Filed Jan. 16, 1958
Fig. 2.
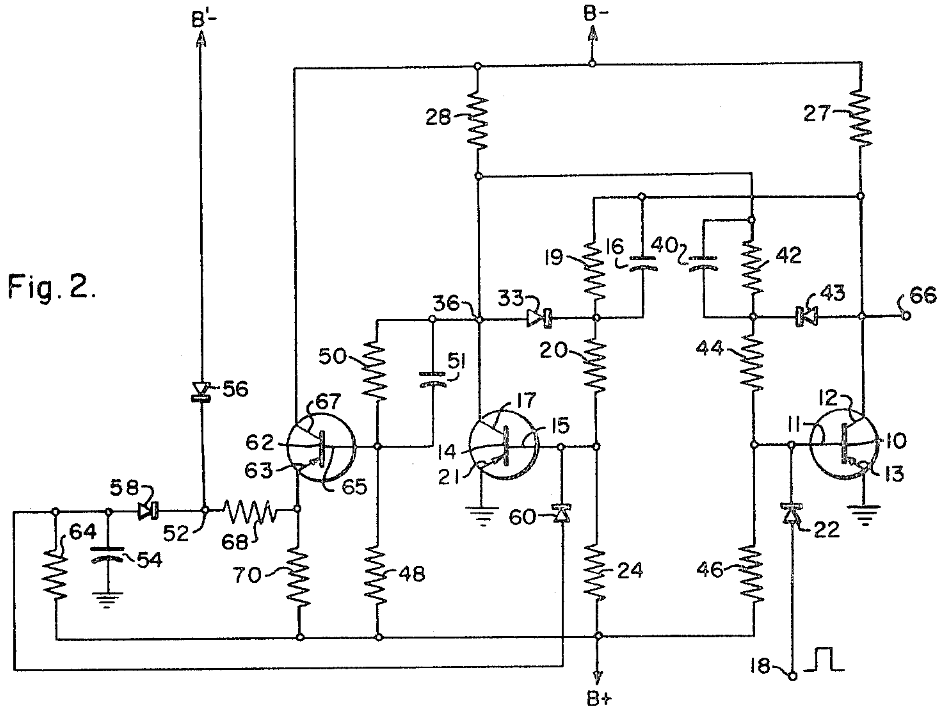
Fig. I.
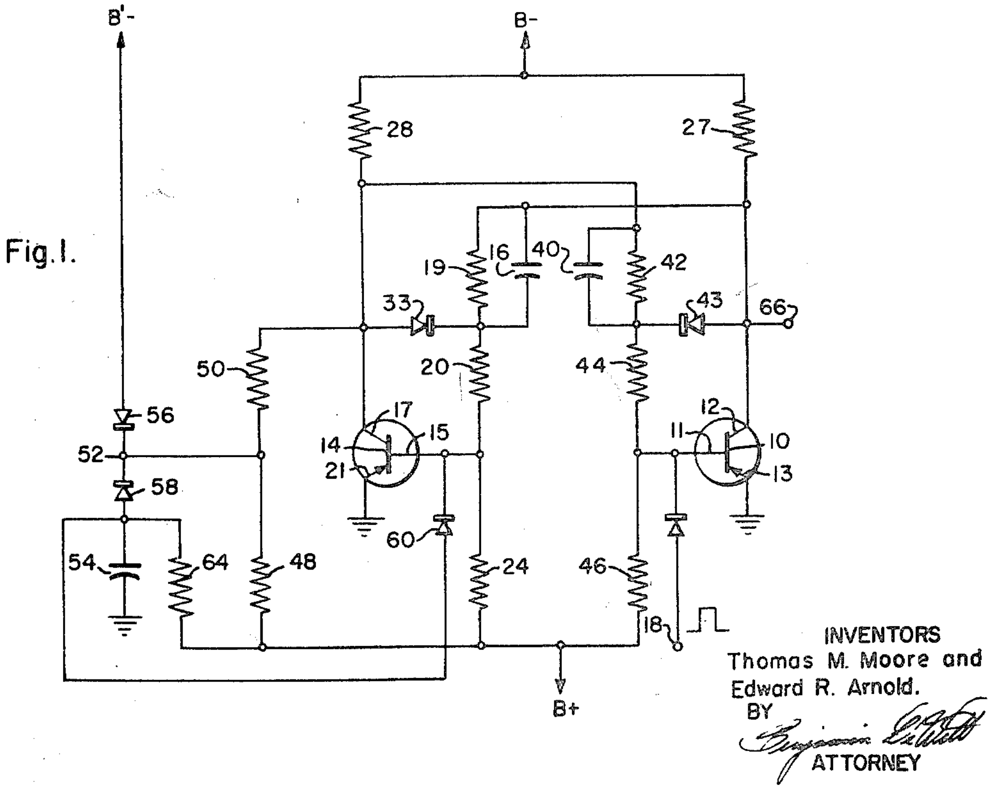
INVENTORS
Thomas M. Moore and
Edward R. Arnold.
BY
ATTORNEY United States Patent Office 2,962,606

Patented Nov. 29, 1960

2,962,606

MONOSTABLE TRANSISTOR CIRCUITS

Edward R. Arnold, Brooklyn, N.Y., and Thomas M. Moore, Glen Burnie, Md., assignors to Westinghouse Electric Corporation, East Pittsburgh, Pa., a corporation of Pennsylvania Filed Jan. 16, 1958, Ser. No. 709,409

2 Claims. (Cl. 307—88.5)

This invention relates to triggered circuits and more particularly to monostable multivibrator circuits utilizing transistors.

It has previously been proposed to provide multivibrator circuits utilizing a pair of electron valves in various symmetrically connected arrangements for achieving a stable conducting state in one of the valves and a quasi-stable conducting condition in the other valve. which quasi-stable or astable condition has a time duration dependent on resistance-capacitance timing means. Likewise, semiconductor devices have been previously utilized in both bistable and monostable trigger circuits. In the previous monostable multivibrator circuits utilizing transistors, difficulty has been encountered in that the output waveform is usually more or less trapezoidal and usually does not have the desired degree of sharpness at the leading and trailing edges of the waveform. Further difficulty has been encountered in achieving output waveforms of a predetermined fixed time duration unaffected by variations or changes in the characteristics of the transistor devices utilized in the circuit.

Accordingly, it is an object of the present invention to provide an improved monostable transistor circuit which will produce an output waveform of predetermined duration in response to a trigger pulse regardless of differences in the characteristics of the transistors used therein.

It is another object to provide an improved single-shot multivibrator having an output pulse waveform of superior reliability and accurate time duration.

It is a further object to provide a regenerative transistor pulse amplifier or monostable transistor circuit having superior stability and reliability and developing an output waveform of shape and time duration substantially independent of the transistor characteristics.

It is an additional object of the invention to provide a monostable transistor circuit in which no adjustment of the circuit components is necessary to compensate for the differences of characteristics of individual transistors.

These and other objects of the invention will be apparent from the following description taken in accordance with the accompanying drawing throughout which like reference characters indicate like parts, which drawing forms a part of this application and in which:

Figure 1 is a schematic diagram of a monostable transistor circuit embodying the invention; and Fig. 2 is a schematic diagram of a variation of the embodiment of the invention shown in Fig. 1.

In its principal aspect, the present invention takes the form of a gate waveform generator comprising a monostable circuit including a pair of transistor semiconductor devices in which circuit a first transistor is normally nonconductive and the second transistor is normally conducting at near saturation level. The circuit is triggered to its quasi-stable state by input pulses fed to the base electrode of the second transistor. The circuit is recycled to its stable state by means of a resistance-capacitance timing network arranged to be controlled by the collector potential of the first transistor and having an output signal which is controllingly applied to the based electrode circuit of the first transistor.

Referring now to the drawings, 14 indicates a semiconductor device of the type commonly referred to as a transistor having a base electrode 15, a collector electrode 17 and an emitter electrode 21. Numeral 10 indicates a second transistor device having a base electrode 11, a collector electrode 12 and an emitter electrode 13. The emitter electrodes 13 and 21 are connected to a common point of reference potential indicated as ground. The collector electrodes 12 and 17 are connected through similar load resistors 27 and 28 to a source of negative biasing potential B—. A voltage divider comprising a plurality of serially connected resistors 42, 44 and 46 is connected from the collector electrode 17 to a source of positive biasing potential B+. A second and similar voltage divider comprising a plurality of resistors 19, 20 and 24 is connected from the collector electrode 12 of the second transistor to the same positive source of biasing potential B+. A pair of similar capacitors 16 and 40 are respectively connected in parallel with the corresponding resistors 19 and 42. A crystal diode 43 is connected from the collector electrode 12 to the junction point between resistors 42 and 44. A similar crystal diode 33 is connected between the collector electrode 17 and the junction point between resistors 19 and 20. The crystal diodes 33 and 43 may be any one of various known types with the essential criteria being that they constitute non-linear impedance devices having a relatively high resistance when biased in one direction and having a relatively low impedance when biased in the opposite direction. The diode 33 is connected so as to have a low impedance to current flow from the collector 17 toward the resistor 19. The diode 43 is similarly connected to have a low impedance to current flow from collector 12 toward resistor 42. The base electrode 15 of the first transistor 14 is connected directly to the junction point between resistors 20 and 24 and is further connected by means of a crystal diode 60 to a timing circuit to be described hereinafter. The base electrode 11 of the second transistor 10 is connected directly to the junction point between resistors 44 and 46 and is further connected by means of a crystal diode 22 to input terminal 18. The input terminal 18 comprises means for applying initiating trigger pulses to the multivibrator circuit. The crystal diode 22 is connected so as to have a relatively low impedance to current flowing from the input terminal 18 toward the base electrode 11. Thus, the transistor 10 is responsive to positive input signals applied to terminal 18 with respect to ground and is insensitive to negative signals at terminal 18. An output terminal 66 is connected directly to the collector electrode 12 of the second transistor 10. The output waveform as shown in Fig. 1 adjacent the terminal 66 is the output voltage waveform appearing at terminal 66 with respect to ground. The junction point between resistor 28 and the collector electrode of the first transistor 14 is designated as a terminal 36. A third voltage divider comprising a first resistor 48 and a second resistor 50 in series connection extends from the positive source of biasing potential B+ to the terminal 36. A terminal 52 is connected to the junction point between the resistors 48 and 50. A fifth crystal diode 56 is connected between the terminal 52 and a second source of negative biasing potential B—'. The second negative biasing source B—' may be any conventional type of voltage source such as for example a battery with the essential criteria being that the second negative biasing source B—' shall supply a negative voltage somewhat smaller than the voltage supplied by the first negative source B—. A resistance-capacitance timing network comprising a resistor 64 and a capacitor 54 connected in series extends from the source of positive potential B+ to ground. The junction point between resistor 64 and capacitor 54 is connected to terminal 52 by means of a sixth crystal diode 58. The crystal diodes 58 and 56 may be similar to the diodes 33 and 43. Diode 56 is connected or poled so as to have a low impedance-to-current flow from the second negative source B—′ toward the terminal 52. Crystal diode 58 is poled so as to have a relatively low impedance-to-current flow from the capacitor 54 toward the terminal 52. The crystal diode 60 is connected between the upper end of capacitor 54 and the base electrode of the first transistor 14 and is poled so as to have a relatively low impedance-to-current flow from capacitor 54 toward base electrode 15.

The circuit of Fig. 1 as hereinbefore describes operates in substantially the following manner. Let it be assumed for example that the transistor circuit of Fig. 1 is in its stable state with transistor 10 being conducting and transistor 14 being nonconducting. In order to trigger the circuit into its quasi-stable state, a positive trigger pulse is applied to the input terminal 18. Current flow from terminal 18 through crystal diode 22 to base electrode 11 drives the base electrode 11 slightly positive, thereby reducing the emitter-to-base current and consequently reducing the current flow from emitter 13 to collector 12. The voltage drop across load resistor 27 decreases and collector 12 goes negative. The more negative potential at collector 12 is applied to the second voltage divider including resistors 19, 20 and 24 and capacitor 16 charges toward the new potential of collector 12 through a charging path including resistor 20 and the parallel combination of resistor 24 and the emitter-to-base circuit of transistor 14. The flow of capacitor 16 charging current from emitter 21 to base 15 causes transistor 14 to become conductive so that the impedance from emitter 21 to collector 17 is sharply reduced and a large collector current flows through load resistor 28, thereby driving collector 17 and terminal 36 in a positive direction. The more positive voltage at terminal 36 is applied through resistor 42 and resistor 44 to the base electrode of transistor 10, thereby further decreasing the emitter-to-base current in transistor 10 so as to maintain transistor 10 in the nonconducting condition so long as transistor 14 is conducting. When transistor 14 is conducting, the voltage drop from emitter 21 to collector 17 is very small and consequently terminal 36 is only slightly negative with respect to ground. Accordingly the current through resistors 48 and 50 decreases and terminal 52 becomes slightly positive relative to ground. The positive voltage at terminal 52 biases diode 56 in the reverse direction so that diode 56 is nonconductive and constitutes a relatively high impedance. At the time of initiation of conduction in transistor 14, capacitor 54 is fully charged to the voltage of the second negative source B—′. When transistor 14 begins conducting, the undissipated negative charge on capacitor 54 is applied to diode 58 in the reverse biased direction and maintains diode 58 nonconductive. Thus capacitor 54 is not permitted to discharge through diode 58 and resistor 48. Diode 60 is also subjected to the negative charge on capacitor 54 and is in the nonconductive state. Thus capacitor 54 is effectively isolated from transistor 14 and the third voltage divider by the nonconductive diodes 58 and 60. During the time the transistor 14 is conducting, the negative charge on capacitor 54 is applied across resistor 64 and tends to discharge through resistor 64 and the positive voltage source B+. Since capacitor 54 is originally charged to the potential of second negative source B—′, and since it charges toward the positive potential of source B+, it is clear that the total voltage applied to the timing circuit comprising resistor 64 and capacitor 54 is in effect the sum of the voltages of source B+ and the second negative source B—′. This relatively high voltage applied to the timing circuit assures a reliable and accurate RC time interval delay for the control of the transistor 14. In this respect as capacitor 54 charges toward the voltage of source B+, the increasingly positive voltage at the upper end of capacitor 54 is applied to the lower end of crystal diode 60 and when the voltage across capacitor 54 becomes more positive than the base electrode of transistor 14, diode 60 will immediately become conductive. When diode conducts, the positive potential from capacitor 54 is applied to the base electrode 15 and the emitter-to-base control current in transistor 14 is accordingly decreased. The decrease in base current controllingly decreases the collector current and collector 17 rapidly goes negative as the voltage drop across resistor 28 decreases. In response to the more negative voltage at terminal 36, capacitor 40 immediately begins charging and the charge current through capacitor 40 flows through resistor 44 to the base circuit of transistor 10 causing transistor 10 to become conductive. At the same time the now more negative voltage at terminal 36 is applied through resistor 50 to terminal 52 so that terminal 52 is driven negative with respect to the upper end of capacitor 54. Thus, the more negative voltage at collector electrode 17 causes diode 58 to be biased in the forward direction so that diode 58 becomes conductive. Similarly, as the potential at terminal 36 approaches the potential of the first negative source B—, the potential at terminal 52 is driven more negative than the voltage of the second negative source B—′. When terminal 52 becomes more negative than source B—′, diode 56 becomes conductive and clamps the voltage at terminal 52 to the potential of the second negative source B—′. Since diode 58 is conductive, capacitor 54 will charge to the potential of source B—′ and will be held at that potential so long as transistor 14 is nonconducting.

At this point in the sequence of operation, transistor 10 is conducting at near saturation level, transistor 14 is cut off or nonconducting and capacitor 54 is charged to the full potential of the second negative source B—′. The entire circuit is in its original stable state. In the operation of the monostable circuit as heretofore described, it is essential to avoid collector current saturation in transistors 10 and 14 during their respective "on" periods. For example, if transistor 10 were allowed to conduct at saturation level, its cutoff response to the input trigger to terminal 18 would be sluggish, seriously deteriorating the trailing edge sharpness of the output wave shape. High speed response to positive input trigger pulses to terminal 18 is provided in the present invention by feedback action through crystal diodes 43 and 33. Limitation of collector current in transistor 14, for example, is accomplished by the operation of diode 33 substantially as follows: When transistor 14 first becomes conductive, collector 17 becomes less negative with respect to ground due to the large voltage drop across load resistor 28. When the potential of collector electrode 17 approaches the potential of base electrode 15, terminal 36 becomes more positive than the junction between resistors 19 and 20. Accordingly, diode 33 is biased in the forward direction and becomes conductive. A portion of the collector 17 current will flow through diode 33 and resistor 19, thereby reducing the negative potential applied to base electrode 15 so that the emitter-to-base current is held below a predetermined maximum. The predetermined maximum base current is chosen as that which is necessary to limit the collector current to a maximum level below which minority carrier saturation in transistor 14 will not occur. Thus crystal diode 33 operates to apply feedback from collector 17 to base electrode 15 to thereby prevent excessive bias current which would otherwise produce minority carrier saturation in transistor 14. By prevention of minority carrier saturation, the time necessary to trigger transistor 14 from the fully conductive state to the nonconductive state is appreciably reduced so that the fall time of the output pulse at terminal 66 is substantially improved. Crystal diode 43 is connected in the circuit of transistor 10 in identically the same way as diode 33 is connected with transistor 14. Since the circuits are symmetrical, it is already evident that diode 43 provided feedback to the base electrode 11 and limits the maximum collector current in transistor 10 in the same manner as above described with reference to diode 33 and transistor 14.

From the foregoing operational description, it is clear that the time interval during which transistor 14 is nonconductive is determined solely by capacitor 54 and resistor 64 and is completely independent of the notoriously variable and uncertain impedance of the transistors. Accordingly the gate time interval or output pulse appearing at terminal 66 is independent of transistor characteristics and is a sharp rectangular waveform having an accurately predetermined time duration. The accurate and reliable output waveform produced by the circuit of the present invention constitutes a genuine improvement over the slow rising, trapezoidal waveforms usually produced by monostable multivibrator circuits of the prior art.

In Fig. 2 there is shown a variation or second embodiment of the transistor monostable circuit of the invention as shown in Fig. 1. The transistors 10 and 14 as shown in Fig. 2 and the circuits intercoupling the two transistors may be substantially identical to the circuit of Fig. 1 and accordingly the principal components of Fig. 2 are designated by like reference characters to indicate like parts. The apparatus of Fig. 2 is different from that of Fig. 1 in that the collector electrode 17 of the first transistor does not supply currently directly to the capacitor 54. Rather, collector electrode 17 is connected to a voltage divider comprising resistors 48 and 50 with the junction point between resistors 48 and 50 being connected to the base electrode 65 of a third transistor 62. The collector electrode 67 of the third transistor is connected directly to the first negative potential source B– and the emitter electrode 63 is connected through a load resistor 70 to the positive voltage source B+. A bypass capacitor 51 is connected in parallel with resistor 50 in order to provide a low impedance path to alternating current components flowing from terminal 36 to base electrode 65. Thus, transistor 62 is connected as an emitter follower with the voltage changes appearing at the collector electrode of the first transistor 14 being controllingly applied to the base electrode 65 whereby the voltage appearing across resistor 70 is a current amplified signal corresponding in phase to the input signal appearing across resistor 48. The emitter electrode 63 is connected to terminal 52 through a series resistor 68. The timing circuit comprising crystal diode 56, crystal diode 58, capacitor 54 and resistor 64 may be substantially identical to the timing circuit as shown in Fig. 1 and is accordingly designated by like reference characters. The upper end of capacitor 54 is connected to crystal diode 60 the same as in the circuit of Fig. 1.

The operation of the monostable transistor circuit of Fig. 2 is similar to that of the apparatus of Fig. 1 except that the charging current for capacitor 54 is supplied by the emitter-to-collector circuit of transistor 62 rather than being supplied directly from the collector circuit of transistor 14 as in Fig. 1. More specifically, in the apparatus of Fig. 2, when transistor 14 becomes conducting, terminal 36 is driven more positive until it is only slightly negative with respect to ground. The voltage change appearing at 36 is applied through capacitor 51 and resistor 50 and base electrode 65 of the third transistor is driven more positive thereby increasing the emitter-to-collector impedance of the transistor 62. As the emitter-to-collector current through transistor 62 decreases, emitter 63 becomes positive with respect to ground. This more positive potential appears at terminal 52 and diodes 56, 58 and 60 are effectively reverse biased thereby so that they are nonconducting during the time interval when transistor 14 is conducting. In this respect the operation of diodes 56, 58 and 60 is the same as the corresponding elements in the apparatus of Fig. 1.

In summary, the transistor 62 operates as an emitter follower to control the charging of timing capacitor 54 in response to the signal applied to base electrode from terminal 36. The subsequent timing operation of capacitor 54 is the same as heretofore described in connection with Fig. 1. The provision of transistor 62 isolates the collector circuit of transistor 14 from the timing circuit and thereby prevents capacitive loading of transistor 14 by the timing circuit including capacitor 54 and resistor 64. Removal of the capacitive loading on transistor 14 provides improved trigger sensitivity to the monostable circuit and makes it possible to obtain a much sharper wave shape at the collector electrode 17. The circuit of Fig. 2 therefore is particularly advantageous in applications where it is desired to take a second output waveform from the terminal 36 in addition to the first gate output at terminal 66.

There has been described a monostable transistor circuit capable of developing an output pulse having an accurately predetermined time duration which is independent of the amplitude or wave shape of the input trigger pulse. The circuit as described is very simple in construction and does not require adjustment for the varying characteristics of transistors. Likewise, the time duration of the output gate is determined solely by capacitor 54 and resistor 64 and is substantially independent of the internal impedances of the transistors utilized.

While the present invention has been shown in one form only, it will be obvious to those skilled in the art that it is not so limited but is susceptible of various changes and modifications without departing from the spirit and scope thereof. For example, the invention should not be deemed limited to the P-N-P type transistors as shown and described but is equally applicable to other types such as point contact transistors or N-P-N transistors, with appropriate biasing polarities being provided for the type of transistors utilized.

We claim as our invention:

1. In a multivibrator circuit, first and second electron valves each having an output electrode, an electron emitter electrode and a control electrode, a first resistance means connecting the output electrode of the first valve to the control electrode of the second valve, second resistance means connecting the output electrode of the second valve to the control electrode of the first valve, means connecting the emitter electrodes directly to ground, means connecting the control electrodes through respective resistances to a first source of potential, means connecting the output electrodes through respective load resistances to a second source of potential, an input circuit connected to the control electrode of said second valve for applying signals thereto whereby said second valve may be made non-conductive and said first valve may be made conductive and a timing network coupled between the output electrode and the control electrode of said first valve, said network including a capacitor, a source of direct current potential and switch means connected serially with said capacitor across said direct current source, means controllingly connecting the output electrode of said first electron valve to said switch means so as to render said switch means conductive during the non-conductive period of said first valve and non-conductive during the conductive period of said first valve, means connected to said capacitor for discharging the capacitor at a predetermined rate during said conductive period, and circuit means connected between said capacitor and the control electrode of said first valve for applying a trigger signal thereto in response to a charge level on said capacitor corresponding to a predetermined time interval.

2. In combination, first and second transistors, first impedance means connected between the collector electrode of said first transistor and the base electrode of said second transistor, second impedance means connected between the collector electrode of said second transistor and the base electrode of said first transistor, resistance means individual to and operative as a load for each transistor and connecting the collector electrode thereof to a source of potential, means directly connecting the emitter electrodes of said transistors to a point of reference potential, circuit means connected to each of said base electrodes for biasing them with respect to said emitter electrodes, an input circuit connected to an electrode of said second transistor for applying trigger signals thereto whereby said second transistor may be changed from a conducting condition to a non-conducting condition, first and second unilaterally conductive devices respectively connected between said collector electrodes and said first and second impedance means to permit current flow from each collector electrode to the corresponding base electrode, and timing means including a capacitor and switch means serially connected to a source of potential, with said switch means being connected to the collector electrode of said first transistor so as to be controlled thereby to permit charging of said capacitor only during the non-conducting period of said first transistor, means connected to said capacitor for discharging said capacitor at a predetermined rate during the conductive period of said first transistor, and means connected between said capacitor and the base electrode of said first transistor for applying a cutoff trigger signal to said first transistor in response to a charge level on said capacitor corresponding to a predetermined discharge time interval.

References Cited in the file of this patent

UNITED STATES PATENTS

| | | |
|---|---|---|
| 2,423,931 | Etter | July 15, 1947 |
| 2,702,856 | Zaffarano | Feb. 22, 1955 |
| 2,787,727 | Maure et al. | Apr. 2, 1957 |
| 2,884,544 | Warnock | Apr. 28, 1959 |

OTHER REFERENCES

Philco, Application Notes on the Philco Surface Barrier Transistor, May 1956.